United States Patent
Berard

(10) Patent No.: US 7,412,305 B2
(45) Date of Patent: Aug. 12, 2008

(54) POWER SUPPLY DETECTION DEVICE AND METHOD

(75) Inventor: Brian J. Berard, Highland Village, TX (US)

(73) Assignee: Tellabs Bedford, Inc., Bedford, TX (US)

( * ) Notice: Subject to any disclaimer, the term of this patent is extended or adjusted under 35 U.S.C. 154(b) by 650 days.

(21) Appl. No.: 11/118,787

(22) Filed: Apr. 29, 2005

(65) Prior Publication Data

US 2005/0258941 A1 Nov. 24, 2005

Related U.S. Application Data

(60) Provisional application No. 60/568,660, filed on May 6, 2004.

(51) Int. Cl.
*G05D 11/00* (2006.01)
(52) U.S. Cl. .................................................... 700/297
(58) Field of Classification Search ........................ None
See application file for complete search history.

(56) References Cited

U.S. PATENT DOCUMENTS

| | | | |
|---|---|---|---|
| 6,169,389 B1 | 1/2001 | Chen | 320/166 |
| 6,288,883 B1 | 9/2001 | Chen | 361/58 |
| 6,523,133 B2 * | 2/2003 | Shin'ichi et al. | 714/15 |
| 6,608,900 B1 | 8/2003 | Yancey et al. | 379/413 |
| 6,965,403 B2 * | 11/2005 | Endo | 348/231.2 |
| 7,139,208 B2 * | 11/2006 | Arimoto et al. | 365/222 |
| 2006/0290791 A1 * | 12/2006 | Takane | 348/231.99 |

* cited by examiner

*Primary Examiner*—Albert DeCady
*Assistant Examiner*—Chad Rapp
(74) *Attorney, Agent, or Firm*—Baker Botts L.L.P.

(57) ABSTRACT

A power supply detection circuit monitors an input voltage and generates a magnitude signal representative of a supply voltage magnitude. Timing signals are generated relative to a transient condition associated with connection to an input voltage. A data store receives timing signals and stores the magnitude signal at a timing interval so that the stored magnitude signal is representative of a predetermined power supply magnitude. The stored magnitude signal is used to automatically configure power protection circuitry and monitoring circuitry.

22 Claims, 8 Drawing Sheets

POWER SUPPLY DETECTION DEVICE AND METHOD

This patent application claims the benefit of U.S. Provisional Application Ser. No. 60/568,660, filed on May 6, 2004, the entire disclosure of which is incorporated herein by reference.

This patent application generally relates to power distribution systems, and particularly relates to detecting a predetermined magnitude of a power supply voltage upon connection to the power supply voltage.

A communication system for providing voice, data and/or video communications to multiple subscribers may comprise a distribution unit and multiple remote network units. The distribution unit is centrally located, such as in a central office or in a roadside service cabinet, while the multiple remote network units are remotely located to provide voice, data and/or video communications to multiple subscribers. The remote units receive both power and communication data from the distribution unit.

Power is provided to the remote units via a direct current (DC) power signal transmitted over a pair of source and return power lines. Each remote unit is designed to operate at a minimum input voltage magnitude. The line distance between the remote units and the distribution unit causes a proportional decrease in the magnitude of the power signal due to the line resistance. Accordingly, the power signal that is transmitted at the distribution unit is typically in excess of the required minimum input voltage magnitude required at the remote unit so that the remote units may be remotely located up to a maximum specified line distance. For example, if each remote unit is designed to operate at a minimum input voltage magnitude of 75 $V_{DC}$, then a transmitted power signal having a magnitude of 140 $V_{DC}$ may accommodate a maximum service distance of 5 Kft. The service distance may be increased by increasing the magnitude of the transmitted power signal. For example, by increasing the transmitted supply voltage to 185 $V_{DC}$, the service area may be extended to over 7 Kft.

Often the remote units include power protection and monitoring circuitry to manage power distribution in response to low voltage conditions or high current conditions on the source and return power lines. These conditions may occur during increased load conditions. The power protection and monitoring circuitry, however, is typically designed for a predetermined supply voltage magnitude, e.g., 140 $V_{DC}$ and line drops associated with a 140 $V_{DC}$ source, and may not operate properly if connected to a power line carrying a different supply voltage magnitude, e.g., 185 $V_{DC}$.

A power supply detection circuit monitors an input voltage and generates a magnitude signal representative of a supply voltage magnitude. Timing signals are generated relative to a transient condition associated with connection to an input voltage. A data store receives timing signals and stores the magnitude signal at a timing interval so that the stored magnitude signal is representative of a predetermined power supply magnitude. The stored magnitude signal is used to automatically configure power protection circuitry and monitoring circuitry.

DRAWINGS

DETAILED DESCRIPTION

Figure 1:
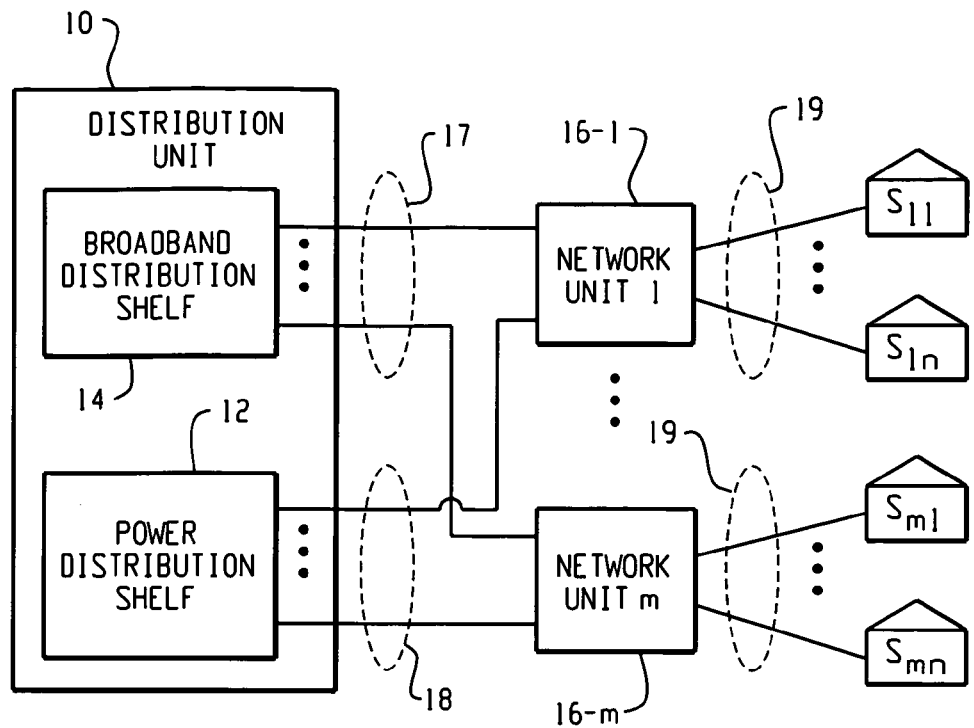
FIG. 1 is a block diagram of an example communication system.

FIG. 1 is a block diagram of an example communication system. The communication system comprises a distribution unit 10 and a plurality of network units 16-1 . . . m. The distribution unit 10 may provide voice, data and/or video communications to each of the network units 16-1 . . . m, which, in turn, may provide voice, data and/or video communications to a plurality of corresponding subscribers $S_{11}$-$S_{mn}$ via corresponding cables 19.

The distribution unit 10 includes a power distribution shelf 12 and a broadband distribution shelf 14. The broadband distribution shelf 14 facilitates voice, data and/or video communications to and from the network units 16-1 . . . m via cables 17, and the power distribution shelf 12 provides power to the network units 16-1 . . . m via cables 18.

The communication system of FIG. 1 may be implemented in a fiber optic based network, in which voice, data and/or video communications are transmitted to and from optical network units 16-1 . . . m over fiber optic cables 17. The optical network units 16-1 . . . m convert the optical communication data received from the broadband distribution shelf 14 into electrical communication signals and transmit the electrical communication signals to the corresponding subscribers $S_{11}$-$S_{mn}$ over corresponding copper cables 19. The copper cables 19 may include twisted pair cabling and coaxial cabling, or other copper-based communication wiring. The optical network units 16-1 . . . m also convert the electrical communication data received from the subscribers $S_{11}$-$S_{mn}$ into optical communication signals and transmit the optical communication signals to the broadband distribution shelf 14.

The power distribution shelf 12 provides power to the optical network units 16-1 . . . m via a corresponding plurality of conductors 18. In the system shown in FIG. 1, each conductor comprises a source and return pair, and the power distribution shelf 12 is an extended reach power distribution shelf that provides a line voltage of −185 $V_{DC}$ over the conductor pairs 18. Previous optical communication systems provided a −140 $V_{DC}$ line voltage at the power distribution shelf 12, and thus the distance between each network unit 16 and the distribution unit 10 was limited to approximately 65 $V_{DC}$ in line drop. By increasing the line voltage to −185 $V_{DC}$, the maximum allowable distance between each network unit 16 and the distribution unit 10 may be proportionally extended. For example, the power distribution shelf 12 may support a service area of approximately 7.1Kft on 22 AWG wire at a load of approximately 35 W per optical network unit 16. Lower line voltages, such as −140 $V_{DC}$, may also be utilized.

The optical network units 16-1 . . . m typically include power supply circuits and power protection and monitoring circuits. Similar circuits may be found in U.S. Pat. No. 6,169,389, entitled "Pumped Capacitive Storage System;" U.S. Pat. No. 6,288,883, entitled "Power Input Protection Circuit;" and U.S. Pat. No. 6,608,900, entitled "Load Management System For An Electrical Device," the disclosures of which are incorporated herein by reference. The power circuits described herein, however, are configurable to operate in one of a plurality of magnitude modes. Each magnitude mode may correspond to a predetermined supply voltage magnitude, e.g., $140V_{DC}$ and line drops associated with a $140V_{DC}$ source, and $185V_{DC}$ and line drops associated with a $185V_{DC}$ source. The power circuits receive indicia of the predetermined power supply magnitude for automatic selection of one of the plurality of magnitude modes.

Figure 2:
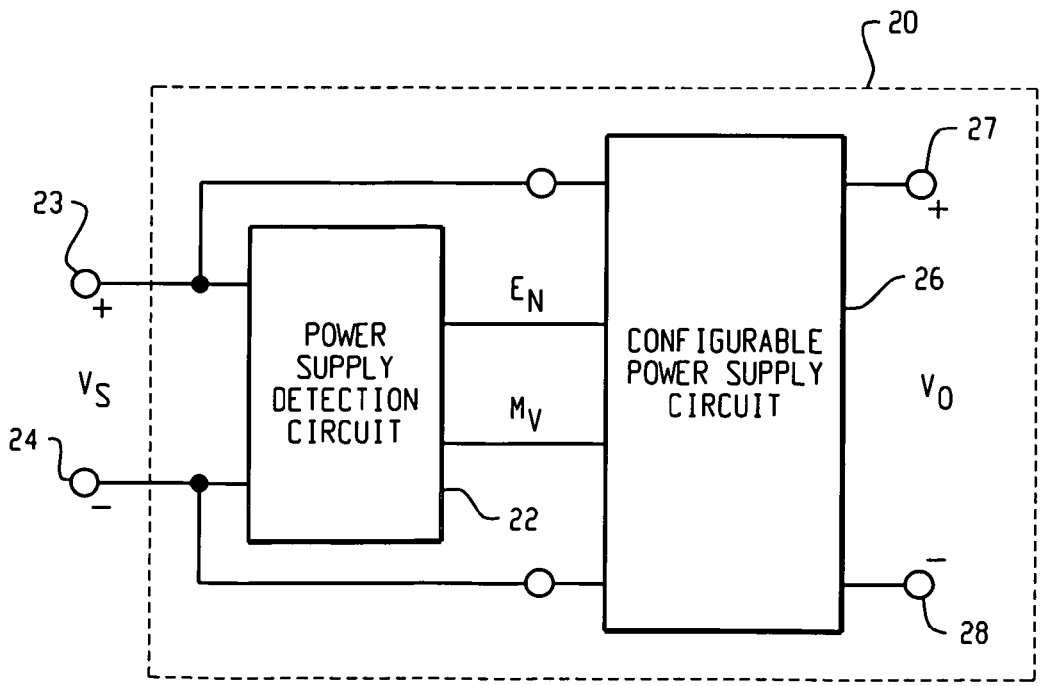
FIG. 2 is a block diagram of an example power supply detection circuit and configurable power supply circuit used in the example communication system.

FIG. 2 is a block diagram 20 of an example power supply detection circuit 22 and configurable power supply circuit 26 used in the example communication system of FIG. 1. The power supply detection circuit 22 is configured to receive an input voltage $V_S$ at the terminals 23 and 24 and generate a magnitude signal $M_V$. The configurable power supply circuit 26 is also configured to receive the input voltage $V_S$ and generate an output voltage $V_O$ at terminals 27 and 28.

The magnitude signal $M_V$ may be representative of a predetermined power supply voltage $V_S$ magnitude, e.g., 140 $V_{DC}$, 185 $V_{DC}$, or some other power supply voltage magnitude. Based on this magnitude signal $M_V$, the configurable power supply circuit 26 may select a corresponding magnitude mode in which to operate, e.g., a 140 $V_{DC}$ magnitude mode or a 185 $V_{DC}$ magnitude mode. Selection of a particular magnitude mode may cause the configurable power supply circuit 26 to selectively enable or disable sub-circuits, change threshold measurement values for particular sub-circuits, or change output values of particular sub-circuits so that the configurable power supply circuit 26 may operate accurately for a predetermined power supply input voltage.

The power supply detection circuit 22 may also be configured to generate an enable signal $E_N$, and the configurable power supply circuit 26 may be further configured to be activated only after receiving the enable signal $E_N$. The actual power supply input voltage may be most accurately measured during a no-load condition or near no-load condition. An inaccurate reading of the power supply voltage magnitude may occur in the power supply detection circuit 22 if the configurable power supply circuit 26 presents a heavy load that causes low-voltage or high-current condition at the power supply input terminals 23 and 24. Temporarily precluding activation of the configurable power supply circuit 26 thus increases the measurement accuracy of the power supply detection circuit 22.

Figure 3:
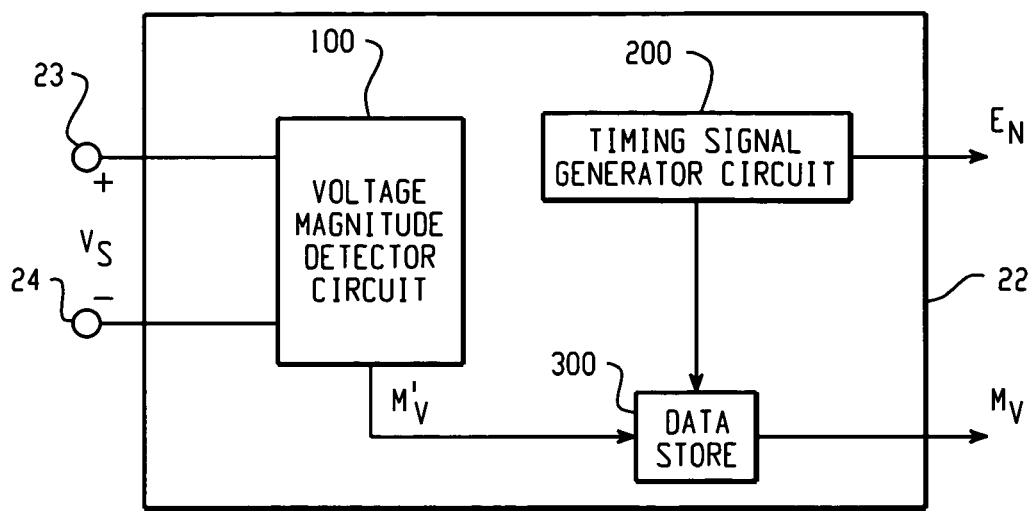
FIG. 3 is a block diagram of an example implementation of the power supply detection circuit.

FIG. 3 is a block diagram of one example implementation of the power supply detection circuit 22. The example implementation includes a voltage magnitude detector circuit 100, a timing signal generator circuit 200, and a data store 300.

The voltage magnitude detector circuit 100 may be configured to receive a power supply voltage $V_S$ from a power supply input and generate a magnitude signal $M'_V$ representative of the magnitude of the supply voltage $V_S$. The magnitude signal $M'_V$ may vary according to an 1/RC time constant transient, as the terminals 23 and 24 may comprise the terminals of a lengthy conductor pair. Accordingly, the supply voltage $V_S$ at the terminals 23 and 24 may vary according to a transient condition associated with an RC charge or discharge curve.

The timing signal generator circuit 200 is configured to generate timing signals that are relative to the transient condition associated with the supply voltage $V_S$ that occurs upon connection to the power supply input terminals 23 and 24.

The timing signals are utilized to enable the data store 300 and to signal when to store the magnitude signal $M_V$ in the data store 300. The timing signal generator circuit 200 may also be used to generate the enable signal $E_N$ to enable the configurable power supply circuit 26.

The timing signals are selected to help ensure that the integrity of magnitude signal $M_V$ stored in the data store 300 is not affected by a transient condition that may occur upon connecting the power supply detection circuit 22 to the terminals 23 and 24. One or more of the timing signals may be set according to a maximum expected time constant for a specified distribution scheme. For example, if a system specification requires a maximum service area from the distribution unit 10 to the optical network units 16-1 . . . m of 8 Kft, then the RC time constant value for 8 Kft of conductor pairs 18 may be calculated and modeled.

The data store circuit 300 is connected to the input voltage magnitude detector circuit 100 and the timing signal generation circuit 200 and is configured to store the magnitude signal $M'_V$ upon receiving a timing signal from the timing signal generation circuit 200. The data store circuit 300 thereafter provides the stored magnitude signal $M_V$ as input to the configurable power supply circuit 26. The configurable power supply circuit 26, in turn, selects one of a plurality of magnitude modes based on the magnitude signal $M_V$.

Figure 4:
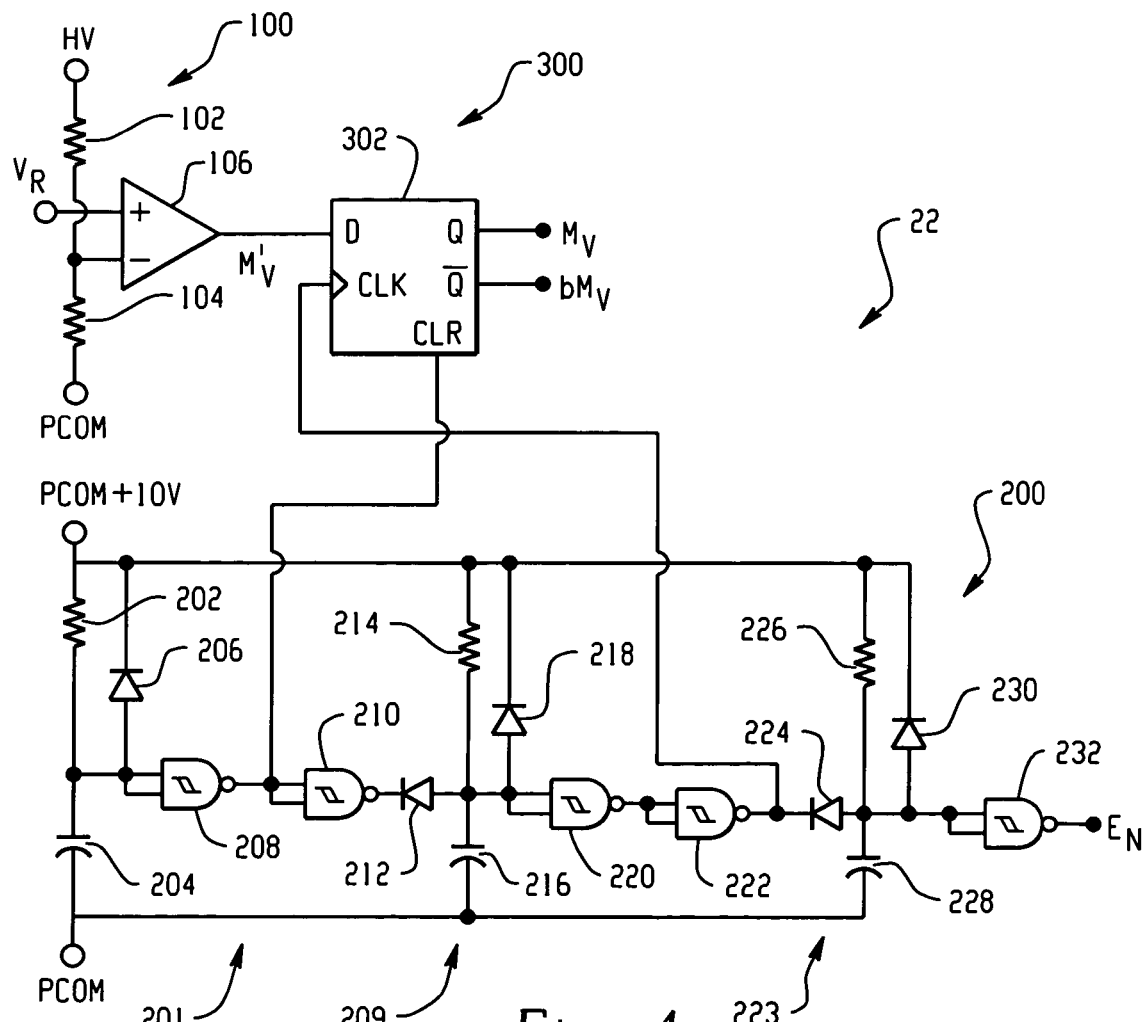
FIG. 4 is a block diagram of another example implementation of the power supply detection circuit.

FIG. 4 is a circuit diagram of another example implementation of the power supply detection circuit 22. The voltage magnitude detector circuit 100 is realized by a voltage divider comprising resistors 102 and 104 and a comparator 106. The node defined by the resistors 102 and 104 provides a divided voltage that is proportional to the difference between a high voltage input HV and a common PCOM. The high voltage input HV and the common PCOM may correspond to the input terminals 23 and 24, respectively. Alternatively, the high voltage signal HV may correspond to the source input terminal 23 conditioned by a power protection circuit.

The comparator 106 compares the divided voltage to a reference voltage $V_R$ to generate the magnitude signal $M'_V$. The reference voltage $V_R$ may correspond to voltage representative of the difference between a plurality of predetermined supply voltages. For example, if either a 140 $V_{DC}$ supply or a 185 $V_{DC}$ supply may be used, then the reference voltage $V_R$ may correspond to 160 $V_{DC}$.

In this example implementation, the magnitude signal $M'_V$ is a digital signal provided at the output of the comparator 106. If the high voltage input HV exceeds 160 $V_{DC}$, then the output of the comparator 106 goes low, which indicates a 185 $V_{DC}$ supply voltage; otherwise, the output of the comparator 106 is high, which indicates a 140 $V_{DC}$ supply voltage.

The magnitude signal $M'_V$ is provided to a flip-flop 302 that is used to realize the data store 300. The flip-flop 302 receives a first timing signal as a CLR input and a second timing signal as a clock signal. The first timing signal enables the flip-flop 302 and the second timing signal causes the flip-flop 302 to store the magnitude signal $M'_V$ and to output a stored magnitude signal $M_V$ and its compliment $bM_V$.

Time delay circuits 201, 209, and 223 are utilized to realize the timing signal generator 200. The first time delay circuit 201 comprises a resistor 202, a capacitor 204, a diode 206 and a NAND gate 208. The resistor 202 and the capacitor 204 define an RC time constant that is associated with the transient condition that may occur at the input terminals 23 and 24 upon connection to the power supply detection circuit 22. Once the capacitor 204 charges to activate the NAND gate 208, the NAND gate 208 generates a first timing signal that enables the flip-flop 302.

The second time delay circuit 209 comprises a resistor 214, a capacitor 216, diodes 212 and 218, and NAND gates 210, 220, and 222. The resistor 214 and the capacitor 216 may define an RC time constant that is associated with the transient condition that may occur at the input terminals 23 and 24 upon connection to the power supply detection circuit 22, or a brief time delay measured from the first timing signal. The output of the first time delay 201 from NAND gate 208 activates the second time delay 209 by causing the NAND gate 210 to go high. The capacitor 216 begins to charge and upon charging to a sufficient voltage activates the NAND gate 220 which, in turn, causes the NAND gate 222 to generate a second timing signal that clocks the flip-flop 302. The flip-flop then stores the magnitude signal $M_V$ and its compliment, $bM_V$.

The third time delay circuit 223 comprises a resistor 226, a capacitor 228, a diode 230, and a NAND gate 232. The resistor 226 and the capacitor 228 define an RC time constant that causes the third time delay circuit 223 to generate the enable signal $E_N$ after the magnitude signal $M_V$ has been stored in the flip-flop 302.

Other circuits may be used to realize the power supply detection circuit 22. For example, an application specific integrated circuit (ASIC) or a processing device may be configured to receive a signal corresponding to the power supply input voltage $V_S$ and generate the magnitude signals $M_V$ and $bM_V$ and the enable signal $E_N$.

Figure 5:
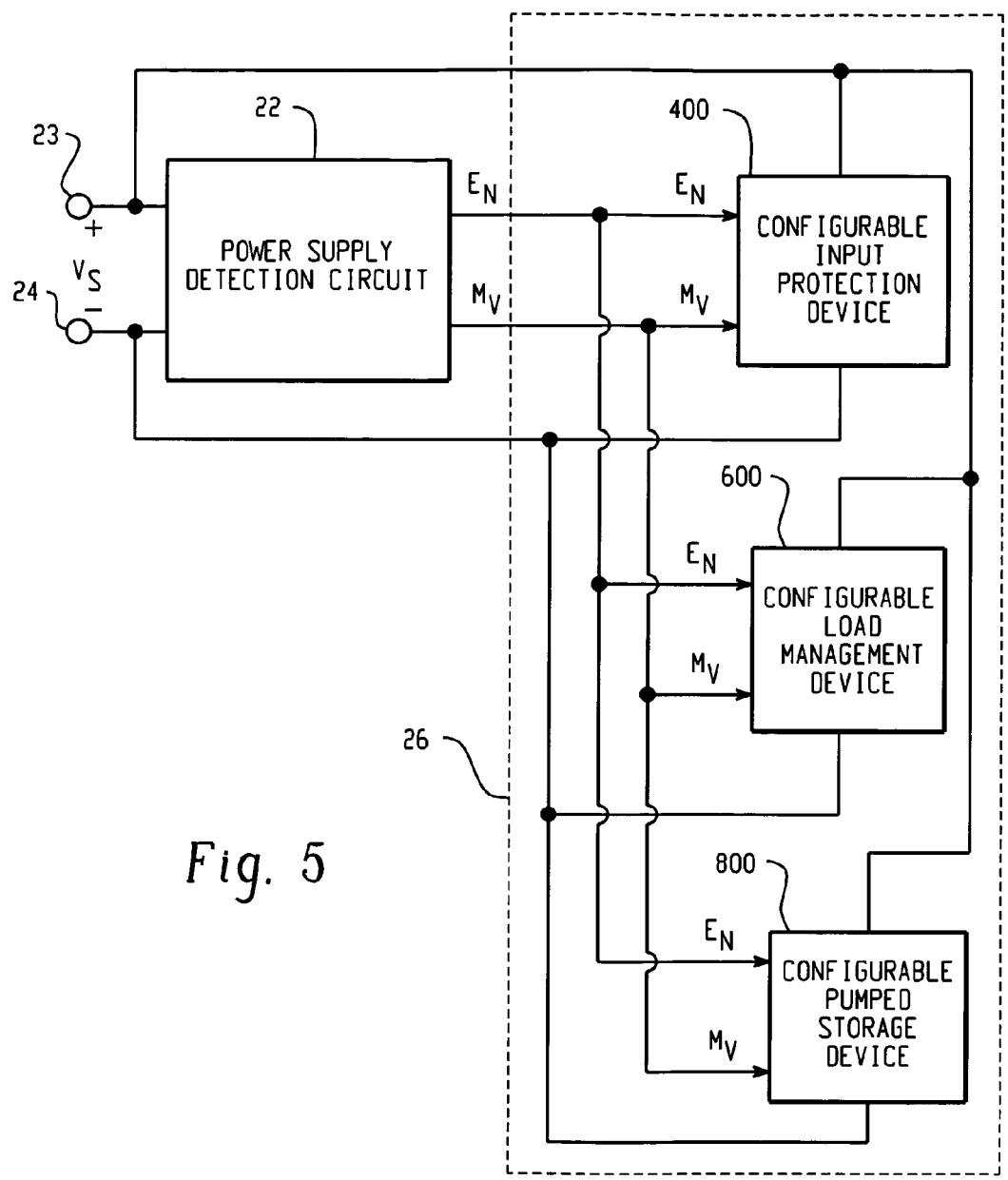
FIG. 5 is a block diagram of the power supply detection circuit and example configurable power supply circuits.

FIG. 5 is a block diagram of the power supply detection circuit 22 and example configurable power supply circuits 26 that include a configurable input protection device 400, a configurable load management device 600, and a configurable pumped storage device 800. The power circuits 400, 600 and 800 are configurable to operate in one of a plurality of magnitude modes based on the magnitude signal $M_V$.

Figure 6:
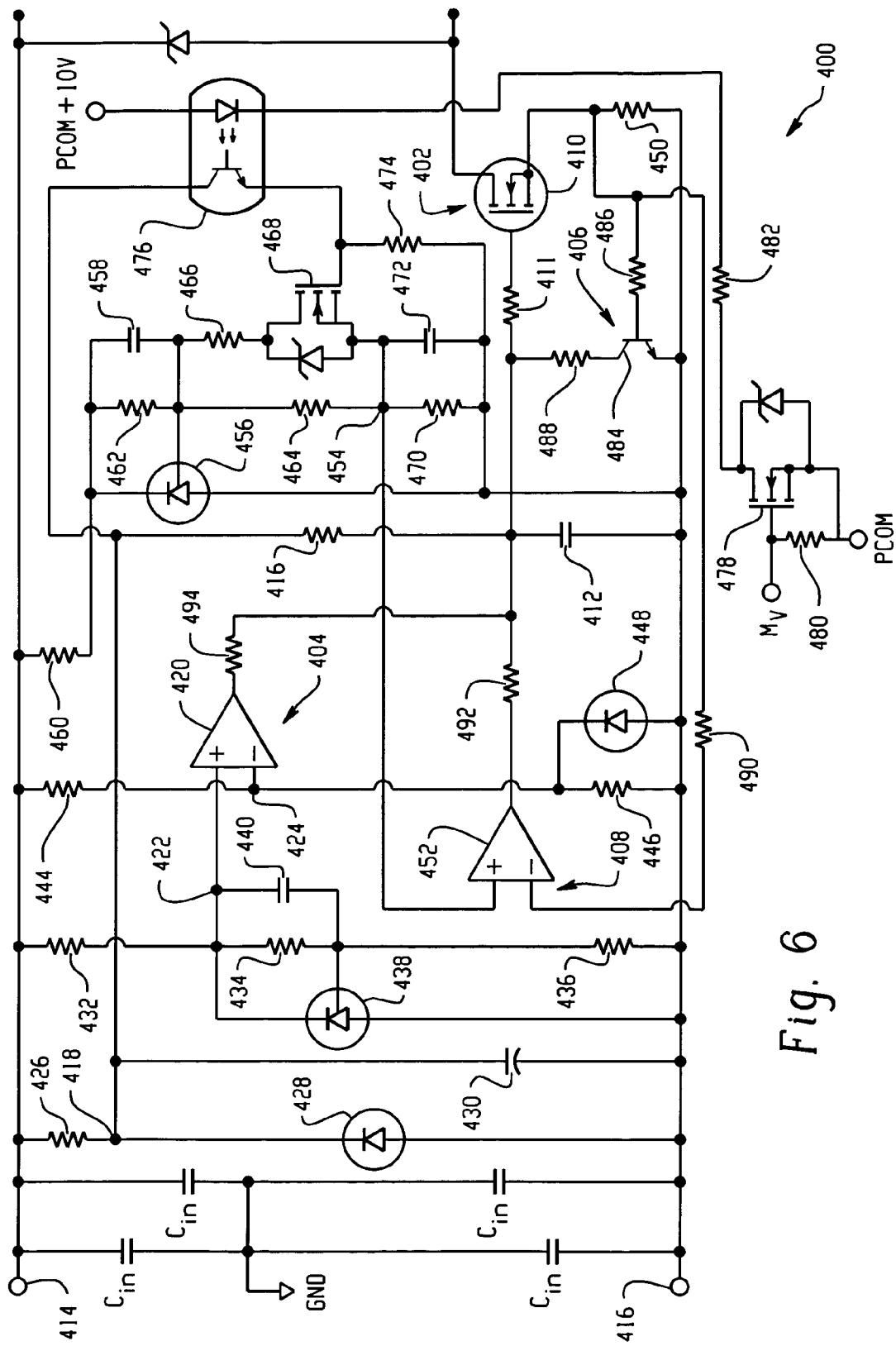
FIG. 6 is an illustration of an example configurable input detection device.

FIG. 6 is an example configurable input protection device 400. The input protection device 400 includes a pass circuit 402, a high-voltage sense circuit 404, a fast current limiter circuit 406, and an input current sensor circuit 408. The pass circuit 402 controls power distribution to a load and is configured to block current flow to a load when in an off state. The high-voltage sense circuit 404 is coupled to the pass circuit 402 and is configured to detect an over-voltage condition and generate an over-voltage signal that causes the pass circuit 402 to switch to the off state. The current limiter circuit 406 is coupled to the pass circuit 402 and is configured to generate a current limiting signal to limit the current flow in the pass circuit 402 in response to a high-current condition and before the input current sensor circuit 408 generates a high over-current signal. The input current sensor circuit 408 is in electrical communication with the pass circuit 402 and is configurable to operate in one of a plurality of magnitude modes.

The pass circuit 402 acts as a high voltage cut-off device as well as a high input current limiting device. The pass circuit 402 may comprise a power MOSFET 410, IGBT, or other device that has high voltage blocking capability and low on-resistance. In the example shown, the MOSFET 410 may operate in at least an on or full-conduction state, an off state, and a current limiting state. The state of the MOSFET 410 is determined by the gate voltage applied at its input gate G via a resistor 411. The gate voltage, in turn, is determined by the voltage across the capacitor 412.

When the capacitor 412 is charged to an on-voltage level, e.g. 10 $V_{DC}$, the MOSFET 410 is in the full-conduction state with a low on-resistance. When the capacitor 412 is discharged to the off-voltage level, e.g., approximately 0 $V_{DC}$, the MOSFET 410 stops conducting and disconnects the internal electronic circuits from the input terminals 414 and 416.

When the capacitor 412 is charged to a current regulation voltage level, e.g., approximately 4 $V_{DC}$, the MOSFET 410 is in the active state and functions as a current regulator.

In the normal operating state, the voltage on capacitor 412 is charged to 10 $V_{DC}$ through resistor 416. The MOSFET 410 is thus at the on-voltage level and is in the low resistance full-conduction state.

During abnormal operating conditions, however, the capacitor 412 voltage is set by one of high-voltage sensing circuit 404, high-current sensing circuit 408, or the fast, current limiting circuit 406 to the appropriate voltage level so that the MOSFET 410 performs either a high voltage protection function or a input current limiting function. When the input voltage across input terminals 414 and 416 exceeds a high voltage threshold, the high-voltage sensing circuit 404 forces the capacitor 412 to the off-voltage level which, in turn, causes the MOSFET 410 to stop conducting and to disconnect the internal electronic circuits from the input terminals 414 and 416. When the current flowing through the MOSFET 410 exceeds a current threshold, the high-current sensing circuit 408 forces the capacitor 412 to the current regulation voltage level, which, in turn, causes the MOSFET 410 to enter the active state and function as a current regulator. The fast current limiting circuit 406 limits the input current through the MOSFET 410 until the sensing circuits 404 and/or 408 force the capacitor 412 to either the off voltage level or current regulation voltage level.

An example high-voltage sensing circuit 404 comprises an on-voltage reference 418, a comparator 420, a comparator voltage reference 422, and an input voltage divider reference 424. The on-voltage reference 418 is generated at a node defined by a resistor 426, a diode 428, and a capacitor 430. The comparator reference voltage 422 is generated by the resistors 432, 434 and 436, a diode 438, and a capacitor 440 that is used to filter the reference voltage. The input voltage divider reference 424 is generated by the voltage divider formed by resistors 444 and 446 and the diode 448.

An example high-current sensing circuit 408 comprises current measuring resistor 450, a comparator 452, and a configurable voltage reference 454. The configurable voltage reference 454 is generated by a diode 456, a capacitors 458 and 472, resistors 460, 462, 464, 466, and 470, and a switch formed by a MOSFET 468 and resistor 474. The MOSFET 468 is controlled by the photocoupler 476, which, in turn, is controlled by a switch formed by MOSFET 478 and resistors 480 and 482. The MOSFET 478 receives the magnitude signal $M_V$ as a gate input.

When the magnitude signal $M_V$ is high, the photocoupler 476 is turned on, which causes the MOSFET 468 to turn on. Turning on the MOSFET 468 causes resistors 464 and 466 to be combined in parallel, which sets the configurable reference voltage 454 at a first value associated with a first magnitude mode. Similarly, when the magnitude signal $M_V$ is low, the photocoupler 476 and the MOSFET 468 are off, which removes the resistor 466 from the parallel combination with 464. The configurable reference voltage 454 is thereby set at a second value associated with a second magnitude mode. The configurable reference voltage 454 is compared to the voltage measured across the current sensing resistor 450 by the comparator 452.

An example fast current limiter 402 may comprise a transistor 484. During a high current state, a large current passes through MOSFET 410 and the current resistor 450. The voltage on the current resistor 450 is provided to the base of the transistor 484 via a resistor 486. If the current is large enough to cause the transistor 484 to start conducting, then the capacitor 412 begins discharging through the resistor 488 and continues to discharge down to the current regulation voltage level of the MOSFET 410, e.g., approximately 4 V.

The voltage at the current resistor 450 is also provided to the negative input terminal of comparator 452 via the resistor 490. If the voltage across the resistor 450 exceeds the configurable reference voltage 454, then the output of the comparator 452 goes low. The low output of the comparator 452, which is coupled to the capacitor 412 via resistor 492, further discharges capacitor 412 to limit the input current to a limited value, depending on the magnitude mode selected. For example, in a 185 $V_{DC}$ mode, the current may be limited to 380 mA, and in a 140 $V_{DC}$ mode, the current may be limited to 470 mA. As the current through the MOSFET 410 falls to the limited value, the voltage across resistor 450 eventually drops and causes the transistor 484 to turn off.

Thus, the current limiting process can occur in two steps. Initially, the transistor 484 quickly discharges the capacitor 412 to the current regulation voltage level, which, in turn, causes the MOSFET 410 to regulate the current. The comparator 452 performs a slower but precise limiting to a value corresponding to a selected magnitude mode.

During a high voltage state, if a large current passes through the MOSFET 410 and the current resistor 450, and is large enough to cause the transistor 484 to start conducting, then the capacitor 412 begins discharging through the resistor 488 and continues to discharge to the current regulation voltage level of the MOSFET 410. If the input voltage across the terminals 414 and 416 exceeds a threshold value corresponding to the comparator reference voltage 422, then the output of the comparator 420 goes low. The output of the comparator 420 is coupled to the capacitor 422 via resistor 494, and thus the capacitor 412 discharges and the MOSFET 410 turns off.

Thus, the high-voltage limiting process may also occur in two steps. Initially, the transistor 484 quickly discharges capacitor 412 to limit current flow during a high voltage transient. The slower response from the comparator 420 then shuts off the MOSFET 410 to protect attached circuits from the over-voltage condition.

The example circuit of FIG. 6 thus includes a high-current sensing circuit 408 that is configurable according to a magnitude mode. A high-voltage sensing circuit 404 that is also configurable in a similar manner may also be included.

Figure 7:
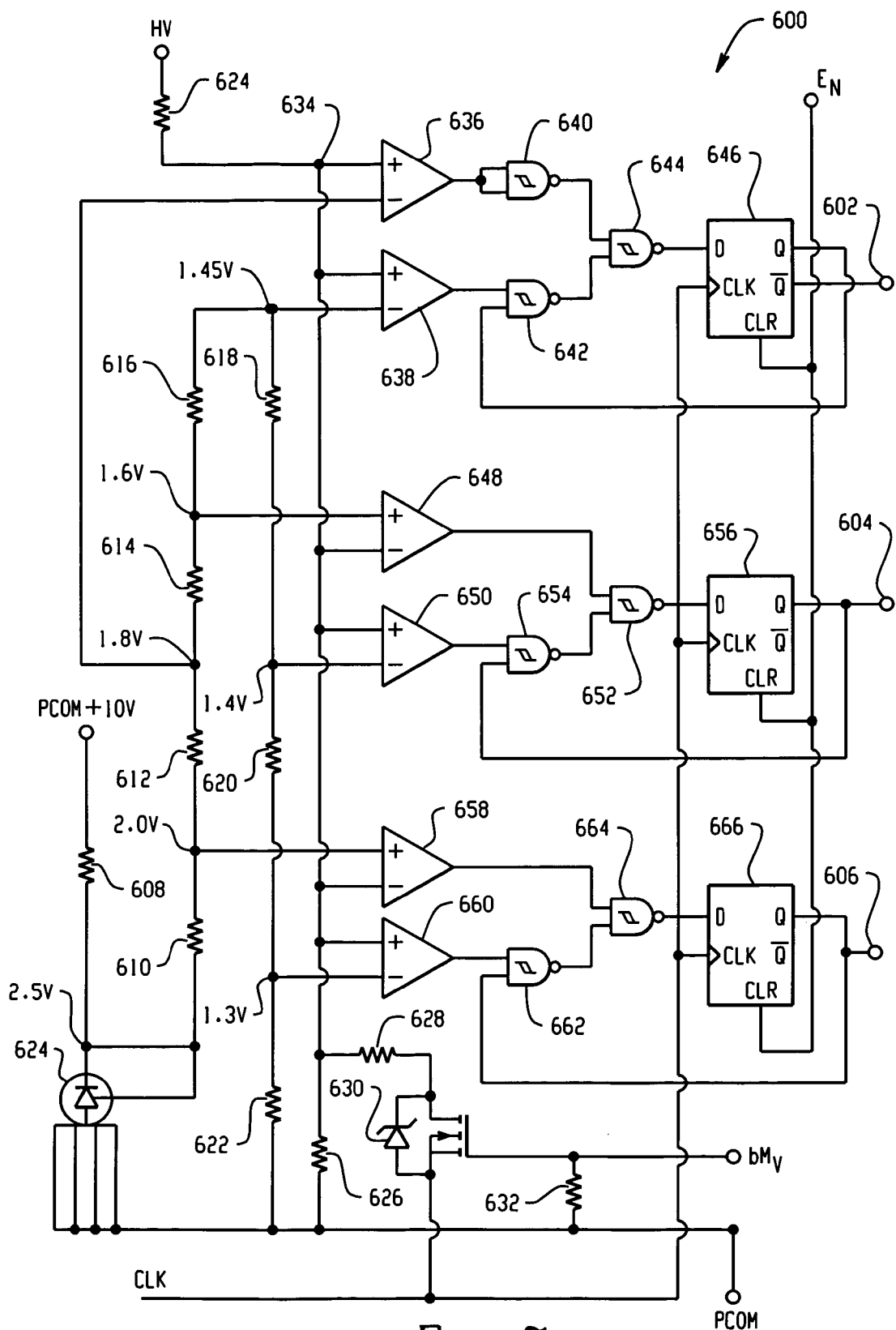
FIG. 7 is an illustration of an example configurable load management device.

FIG. 7 is an example configurable load management device 600. The load management device 600 provides control signals 602, 604 and 606 to either distinct circuits within the network unit 16 to signal those circuits to stop drawing current or to distinct converters within the power supply circuit 26 to cause those converters to turn off during low-voltage conditions. The state of each control signal 602, 604, and 606 depends on the difference between a high voltage input HV and a common PCOM as measured against several reference voltages. The high voltage input HV and the common PCOM may correspond to the input terminals 23 and 24, respectively. Alternatively, the high voltage signal HV may correspond to the source input terminal 23 conditioned by a power input protection circuit.

The configurable load management device 600 may be used in a telecommunications optical network unit 16 that includes a ring generator converter and a capacitive storage battery, as well as other power processing circuits. The voltage level $V_S$ at the power supply input terminals 23 and 24 is monitored to determine if the level $V_S$ is at or approaching various threshold levels. Upon the voltage level $V_S$ attaining a threshold level, control signals 602, 604 and 606 are generated to either enable or disable corresponding controlled circuitry. Generally, the corresponding circuitry is disabled if the voltage level $V_S$ falls below a first corresponding threshold, and is enable if the voltage level $V_S$ exceeds a second corresponding threshold. The first and second corresponding threshold levels typically define a hysteresis window to minimize switching oscillations.

The optical network unit 16 may be designed for a particular power supply voltage magnitude, e.g., 140 $V_{DC}$ or 185 $V_{DC}$. The corresponding first and second threshold levels are scaled to correspond to different reference values for each particular power supply voltage standard, as optimal threshold values for different predefined power supply voltage levels may differ. These scaling adjustments are made according to a selected magnitude mode as indicated by the magnitude signal $bM_V$.

The control signal 602 is a ring control signal that is generated if the power supply voltage $V_S$ falls below a first ring threshold level and which causes a ring converter circuit to cease operating. The control signal 602 is negated if the power supply voltage $V_S$ exceeds a second ring threshold level. For an example 140 $V_{DC}$ power supply level, the first ring threshold level is 72.5 $V_{DC}$ and the second ring threshold level is 90 $V_{DC}$. For an example 185 $V_{DC}$ power supply level, the first ring threshold level is 96.5 $V_{DC}$ and the second ring threshold level is 120 $V_{DC}$.

The control signal 604 is a battery control signal that is generated if the power supply voltage $V_S$ falls below a first battery threshold level and which causes a battery converter circuit for charging a capacitor bank to cease operating. The control signal 604 is negated if the power supply voltage $V_S$ exceeds a second battery threshold level. For an example 140 $V_{DC}$ power supply level, the first battery threshold level is 70 $V_{DC}$ and the second battery threshold level is 80 $V_{DC}$. For an example 185 $V_{DC}$ power supply level, the first battery threshold level is 92.5 $V_{DC}$ and the second battery threshold level is 106 $V_{DC}$.

The control signal 606 is a power control signal that is generated if the power supply voltage $V_S$ falls below a first power threshold level and which shuts down the optical network unit 16. The control signal 606 is negated if the power supply voltage $V_S$ exceeds a second power threshold level. For an example 140 $V_{DC}$ power supply level, the first power threshold level is 65 $V_{DC}$ and the second power threshold level is 100 $V_{DC}$. For an example 185 $V_{DC}$ power supply level, the first power threshold level is 86 $V_{DC}$ and the second power threshold level is 133 $V_{DC}$.

The threshold levels are generated by the resistors 608, 610, 612, 614, 616, 618, 620 and 622, and a diode 624. In the example circuit 600 of FIG. 7, reference voltages of 2.5 $V_{DC}$, 2.0 $V_{DC}$, 1.8 $V_{DC}$, 1.6 $V_{DC}$, 1.45 $V_{DC}$, 1.4 $V_{DC}$ and 1.3 $V_{DC}$ are generated. The reference voltages are set to either a first or second magnitude reference scale in response to the magnitude signal $bM_V$. For the example circuit 600 of FIG. 6, when $bM_V$ is high a magnitude mode corresponding to a 185 $V_{DC}$ power supply is selected, and the switch formed by the MOSFET 630 and resistor 632 is turned on. Resistors 626 and 628 are thus in parallel, and a voltage divider formed by resistors 626, 628 and 624 divides the output at the node 634 to scale the 2.0 $V_{DC}$, 1.8 $V_{DC}$, 1.6 $V_{DC}$, 1.45 $V_{DC}$, 1.4 $V_{DC}$ and 1.3 $V_{DC}$ reference voltages to correspond to input voltages of 133 $V_{DC}$, 120 $V_{DC}$, 106 $V_{DC}$, 96.5 $V_{DC}$, 92.5 $V_{DC}$, and 86 $V_{DC}$, respectively. Likewise, when $bM_V$ is low a magnitude mode corresponding to a 140 $V_{DC}$ power supply is selected, and the switch formed by the MOSFET 630 and resistor 632 is turned off. The voltage divider formed by resistors 624 and 626 scales the reference voltages to correspond to input voltages of 100 $V_{DC}$, 90 $V_{DC}$, 80 $V_{DC}$, 72.5 $V_{DC}$, 70 $V_{DC}$, and 65 $V_{DC}$.

The control signal 602 is generated by comparators 636 and 638, NAND gates 640, 642, and 644, and a flip-flop 646.

The inverting terminals of the comparators 636 and 638 are connected to the 1.8 $V_{DC}$ and 1.45 $V_{DC}$ references, respectively. The comparator 636 outputs a high signal when the high voltage signal HV is greater than 90 $V_{DC}$ in the 140 $V_{DC}$ magnitude mode or 120 $V_{DC}$ in the 185 $V_{DC}$ magnitude mode, and the comparator 638 outputs a high signal when the high voltage signal HV is greater than 72.5 $V_{DC}$ in the 140 $V_{DC}$ magnitude mode or 96.5 $V_{DC}$ in the 185 $V_{DC}$ magnitude mode.

The NAND gates 640, 642, and 644 and the flip-flop 646 implement a hysteresis function between the thresholds by using positive feedback from the flip-flop 646 output Q to the input of the NAND gate 642. The flip-flop 646 resets the ring control signal 602 to the low state when the voltage signal HV is greater than 90 $V_{DC}$ in the 140 $V_{DC}$ magnitude mode or 120 $V_{DC}$ in the 185 $V_{DC}$ magnitude mode. When the ring control signal 602 is in the low state, the ring generator converter is operable. Likewise, the flip-flop 646 sets the ring control signal 602 to the high state when the high voltage signal HV is less than 72.5 $V_{DC}$ in the 140 $V_{DC}$ magnitude mode or 96.5 $V_{DC}$ in the 185 $V_{DC}$ magnitude mode. When the ring control signal is in the high state, the ring generator converter is inoperable. The ring control signal will remain high until the high voltage signal HV rises above 90 $V_{DC}$ in the 140 $V_{DC}$ magnitude mode or 120 $V_{DC}$ in the 185 $V_{DC}$ magnitude mode.

The control signal 604 is generated in a similar manner by comparators 648 and 650, NAND gates 652 and 654, and flip-flop 656. Likewise, the control signal 606 is generated in a similar manner by comparators 658 and 660, NAND gates 662 and 664, and flip-flop 666.

Each of the flip-flops 646, 656, and 666 are enabled by the enable signal $E_N$, which is generated by the timing signal generator circuit 200 of FIG. 3, and are driven by a clock signal CLK. Additionally, one of the reference voltages generated by the resistors 608, 610, 612, 614, 616, 618, 620 and 622, and a diode 624 may be utilized as the reference voltage $V_R$ for the voltage magnitude detector circuit 100 of FIG. 3.

Figure 8:
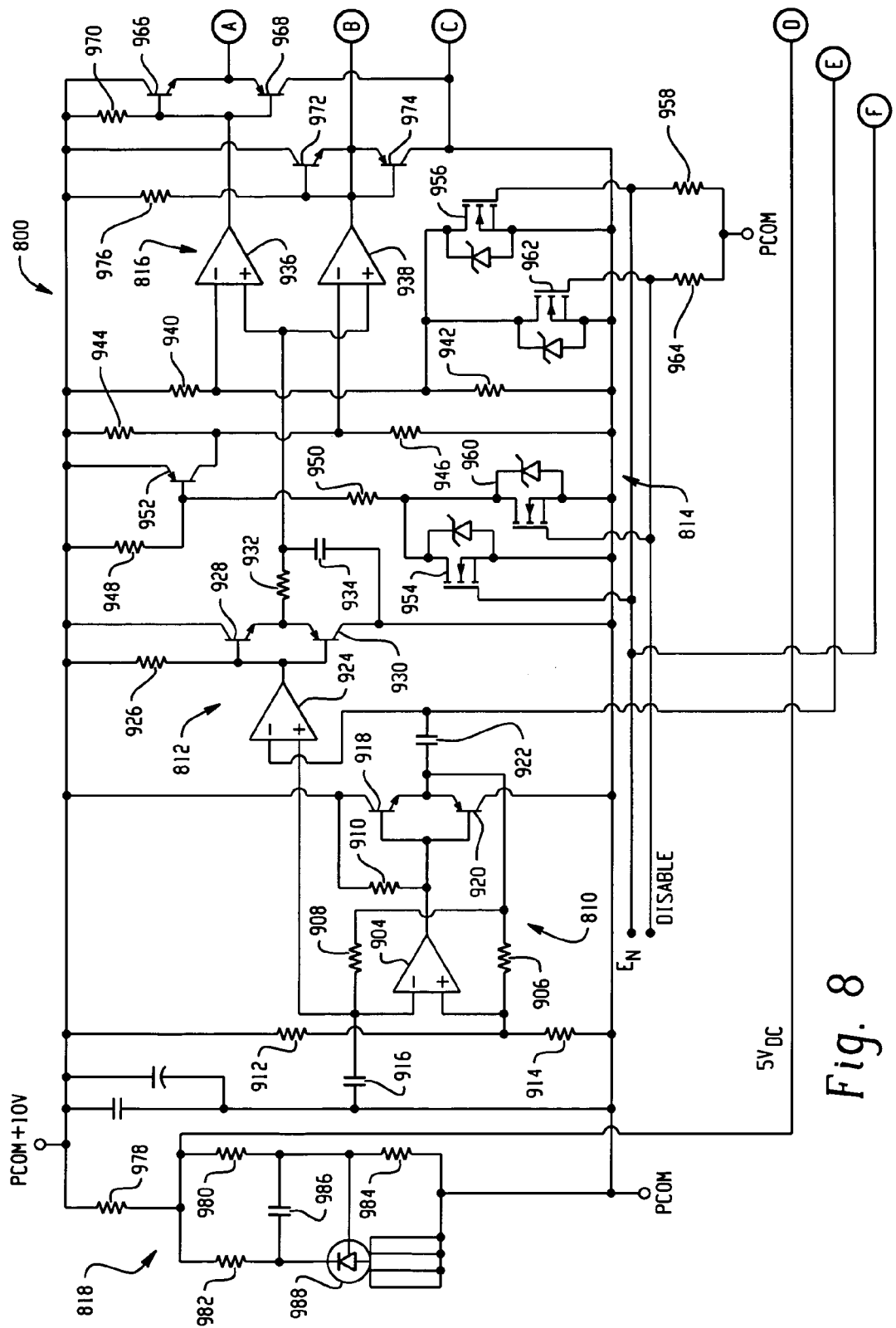
FIGS. 8 and 9 are illustrations of an example configurable pumped storage device.
Figure 9:
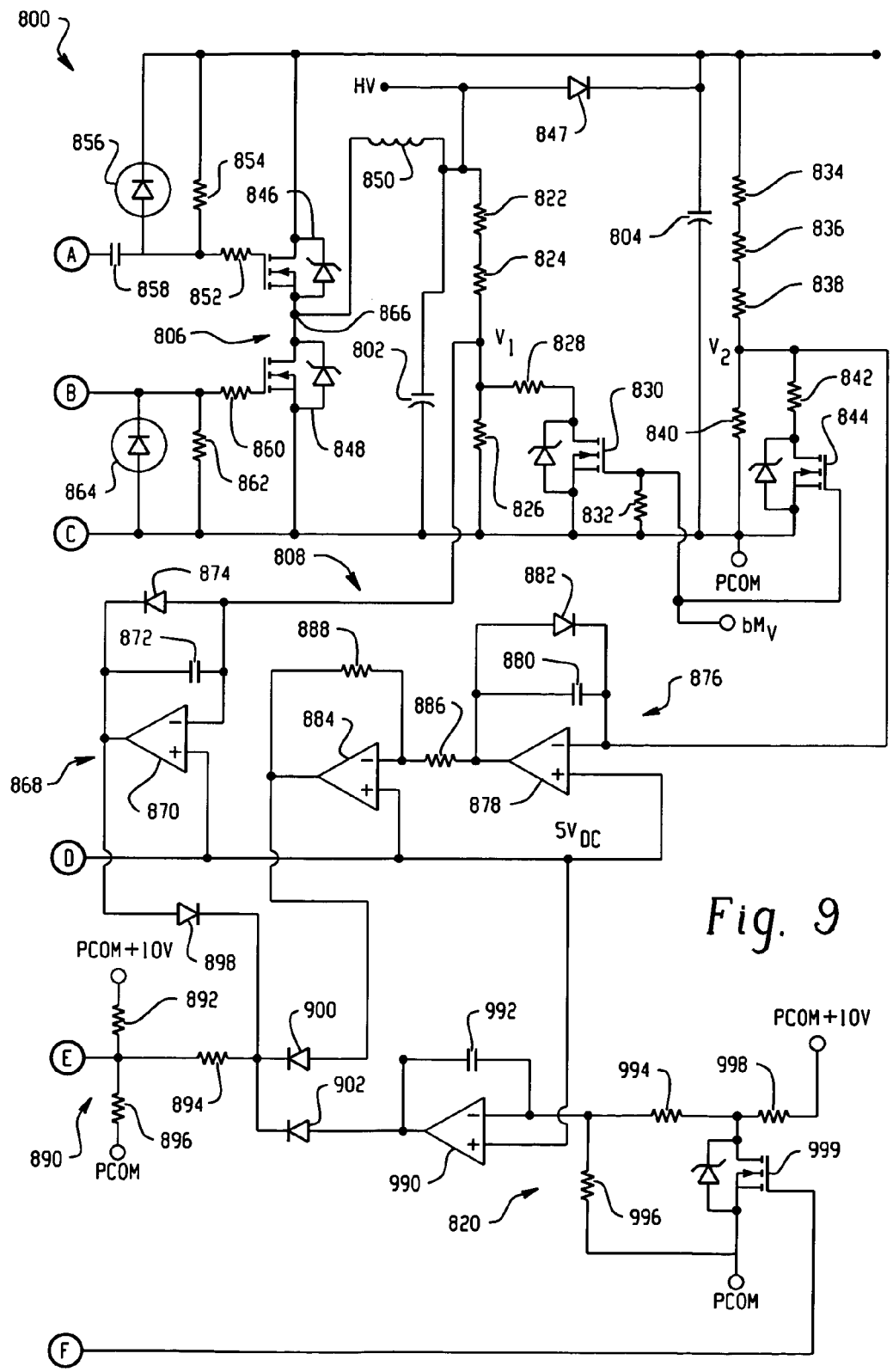

FIGS. 8 and 9 are an example configurable pumped storage device 800. The pumped storage device 800 is operable to store energy in a storage device when the available input power exceeds load power demands. During this state, if the power supply input voltage exceeds a first threshold value, then the pumped storage device 800 charges a storage device, such as a capacitor, to a second threshold value. The pumped storage device 800 is also operable to provide energy from the storage device to the load when the load power demands exceed the available input power. This state is entered when the power supply input voltage falls below the first threshold value.

Each of the first and second threshold values is selected according to the selected magnitude mode in which the pumped storage device 800 is operating. For example, if the first and second magnitude modes correspond to 140 $V_{DC}$ and 185 $V_{DC}$ power supplies, respectively, then the respective first thresholds values are 80 $V_{DC}$ and 103 $V_{DC}$, and the respective second threshold values are 190 $V_{DC}$ and 230 $V_{DC}$.

The first threshold value is set by the configurable resistive divider formed by resistors 822, 824, 826, 828, and the MOSFET 830 and gate resistor 832. The node defined by the resistors 824 and 826 provides a divided voltage $V_1$ that is proportional to the voltage across an input capacitor 802. The voltage across the input capacitor 802 is equal to the difference between a high voltage input HV and a common PCOM. The high voltage input HV and the common PCOM may correspond to the input terminals 23 and 24, respectively. Alternatively, the high voltage signal HV may correspond to the source input terminal 23 conditioned by a power input protection circuit.

The dividing ratio is determined by magnitude signal $bM_V$. If $bM_V$ is low, indicating a 140 $V_{DC}$ magnitude mode, the MOSFET 830 is off and the resistors 822, 824 and 826 divide the voltage $V_1$ by a first ratio corresponding to the first magnitude mode. If $bM_V$ is high, however, indicating a 185 $V_{DC}$ magnitude mode, the MOSFET 830 is on and resistors 826 and 828 are in parallel. Thus, the resistors 822, 824, 826 and 828 divide the voltage $V_1$ by a second ratio corresponding to the second magnitude mode.

The second threshold value is set by the configurable resistive divider formed by resistors 834, 836, 838, 840, and 842, and the MOSFET 844 and gate resistor 832. The node defined by the resistors 838 and 840 provides a divided voltage $V_2$ that is a ratio of the voltage across a storage capacitor 804. If $bM_V$ is low, the MOSFET 844 is off and the voltage $V_2$ is divided by a third ratio corresponding to the first magnitude mode. If $bM_V$ is high, the MOSFET 844 is on and the voltage $V_2$ is divided by a fourth ratio corresponding to the second magnitude mode.

The basic operation of the configurable pumped storage device 800 is as follows. Whenever the high voltage signal HV is above the first selected threshold, pumped storage device 800 will utilize available current at the input terminals 23 and 24 to charge the storage capacitor 804 up to a maximum storage level, which is defined by the second selected threshold. During the charging process, the high voltage signal HV is kept at the first selected threshold, and all available current is used to charge storage capacitor 804. After the storage capacitor 804 is fully charged to the second selected threshold, the high voltage signal HV will then rise to a level determined by the steady load conditions.

During heavy load conditions, the load current may exceed the available current from the input terminals 23 and 24. As a result, the input capacitor 802 will discharge and high voltage signal HV will gradually decrease. When the high voltage signal HV reaches the first selected threshold level, the bi-directional switching converter 806 will reverse direction and discharge the energy in storage capacitor 804 into the input capacitor 802.

The example configurable pumped storage device 800 utilizes boost and buck converter configurations. Other configurations may also be used. The switching converter 806 include MOSFETS 846 and 848 and an inductor 850. The MOSFET 846 in conjunction with resistors 852 and 854 and diode 856 form a first switch and the MOSFET 848 in conjunction with the resistors 860 and 862 and diode 864 form a second switch. The inductor 850 couples the high voltage signal HV to a switch node 866.

The MOSFETS 846 and 848 are driven by a gap drive circuit 816 and alternately connect the node 866, and thus the inductor 850, between PCOM and the storage capacitor 804. When the illustrated switching converter 806 is switched in the direction of the capacitor 802 to the capacitor 804, a boost converter is formed. When in the direction of the capacitor 804 to the capacitor 802, a buck converter is formed.

The pumped storage device 800 operates in a continuous current mode. The ratio of the voltages on the input capacitor 802 and the storage capacitor 804 ($V_3$ and $V_4$ respectively) are determined by the switching duty cycle signal D:

$$V_3 = D * V_4, \text{ or equivalently } V_4 = V_3/D;$$

where the duty cycle signal D is the fraction of the switching cycle that MOSFET 846 is on and MOSFET 848 is off. By controlling duty cycle signal D, the voltage ratio can be changed and the direction of the pump determined.

A control circuit 808 generates control signals to control the switching of the MOSFETS 846 and 848. The control circuit 808 includes a first integrator 868 comprising an amplifier 870, a capacitor 872, and a diode 874, and a second integrator 876 comprising an amplifier 878, a capacitor 880, and a diode 882. The second integrator 878 output is amplified by an amplifier 884 and resistors 886 and 888. The control circuit monitors the voltages across the capacitors 802 and 804 by comparing their respective divided voltages $V_1$ and $V_2$ to a reference voltage of 5 $V_{DC}$.

When the voltage on the input capacitor 802 is below the first selected threshold value, the control circuit 808 sets the duty cycle to a maximum value, close to unity, and the MOSFET 846 is on almost constantly. The storage capacitor 804 is effectively connected to input capacitor 802. When the voltage on the input capacitor 802 approaches and reaches the first selected threshold value from below, the duty cycle D is slowly decreased. This causes the voltage across the capacitor 804 to receive current, thus charging the storage capacitor 804. During this state, all available input current is used to charge the storage capacitor 804 and the voltage on the input capacitor 802 remains at the first selected threshold.

When the voltage across the storage capacitor 804 reaches the second selected threshold, the control circuit 808 stops reducing the duty cycle D and thus stops the charging process. At this point, the available current will flow into the input capacitor 802 and the voltage across the input capacitor 802 will increase until it reaches a voltage level determined by system load conditions. During the time that input capacitor 802 is charging, the duty cycle D is further adjusted to accommodate the voltage-ratio equation above.

The diode 847 facilitates discharging of both capacitors 802 and 804 when the pumped storage device 800 is physically disconnected from a power source from a power source. The capacitor 804 is connected to a single safety discharge circuit activated upon disconnection from the power source.

During an overload condition, the load current demand exceeds available line current and the input capacitor 802 will first discharge to supply the load. The voltage across the input capacitor 802 will decrease in the process. When the voltage across the input capacitor 802 decreases to the first selected threshold, the control circuit 808 will increase the duty cycle D, thus pumping energy from the storage capacitor 804 into the input capacitor 802 and discharging the storage capacitor 804 in the process. The discharging of the storage capacitor 804 will continue until the overload condition ceases, at which time the available line current will exceed the load current. Thereafter, the voltage across the input capacitor 802 will increase to the first selected threshold value, and the pumped storage device 800 will then operate in the charging mode as described above.

The first and second integrator 868 and 876 generate the control signals to control the duty cycle D. The first integrator 868 ramps up when voltage across the input capacitor 802 is below the first selected threshold and ramps down when the voltage is above the first selected threshold. The second integrator 876 ramps up when voltage across the storage capacitor 804 is below the second selected threshold and ramps down when the voltage is above the second selected threshold.

Additional support circuitry is also provided in the example pumped storage device 800 of FIGS. 8 and 9, including an oscillator circuit 810, a pulse-width modulator circuit 812, a dead time controller circuit 814, a gate drive circuit 816, a voltage reference circuit 818, and an inrush control circuit 820.

The oscillator circuit 810 sets a switching frequency, and comprises a comparator 904, resistors 906, 908, 910, 912, and 914, capacitor 916, and transistors 918 and 920. The example oscillator generates a saw-tooth waveform to drive the pulse-width modulator 812.

The pulse-width modulator circuit 812 receives a control signal from the control circuit 808 and controls the duty cycle D. The pulse-width modulator circuit 812 is coupled to the oscillator circuit 810 via a capacitor 922 and comprises a comparator 924, resistor 926, and transistors 928 and 930. The comparator 924 detects the intersection of a control signal received from the control circuit 808 and the oscillator circuit 810 and generates a logic output signal with the desired duty cycle D.

The output of the pulse-width modulator circuit 812 is low pass filtered by the resistor 932 and capacitor 934 and provided to the dead-time control circuit 814. The dead-time control circuit 814 generates reference voltages for the comparators 936 and 938 that define a gap in the gate-drive signals for the MOSFETS 846 and 848. The gap ensures that MOSFETS 846 and 848 are not on at the same instance. The node defined by resistors 940 and 942 outputs a low reference voltage and the node defined by resistors 944 and 946 outputs a high reference voltage. In the example pumped storage device 800 of FIG. 8, the low reference voltage is 3.3 $V_{DC}$ and the high reference voltage is 6.7 $V_{DC}$.

The dead-time control circuit 814 also includes enable and disable switches comprising resistors 948, 950, 958 and 964, and transistors 952, 954, 956, 960, and 962. The transistors 952, 954, and 956 are operatively associated so that the enable signal $E_N$, which is initially high, precludes the gate drive circuit 816 from driving the MOSFETS 846 and 848. By precluding switching operations for the MOSFETS 846 and 848, the high voltage signal HV will not be held at the first selected threshold value while the storage capacitors 802 and 804 charge, and input switching transients are reduced. This is to ensure that the power supply detection circuit 22 may accurately read the input voltage $V_S$ at the terminals 23 and 24 and thereby generate an accurate magnitude signal $M_V$.

The transistors 952, 960, and 962 are likewise operatively associated so that a disable signal DISABLE precludes the gate drive circuit 816 from driving the MOSFETS 846 and 848. This is to expedite capacitive discharging when the pumped storage device 800 is physically separated from the input terminals 23 and 34, and also reduces transients on input power removal.

The comparators 936 and 938 are connected to pull-up resistors 970 and 976, respectively, and produce two pulse-width-modulated waveforms with appropriate gaps for driving the MOSFETS 846 and 848. The transistors 966 and 968, the capacitor 858, the diode 854, and the resistors 852 and 854 perform the gate-drive and level shifting for driving the MOSFET 846. The transistors 972 and 974, the diode 864, and resistors 860 and 862 perform the gate-drive function for the MOSFET 848.

The voltage reference circuit 818 comprises resistors 978, 980, 982 and 984, capacitor 986, and diode 988. In the example voltage reference circuit 818 of FIG. 8, the diode 988 is a 2.5V shunt-regulator IC. The resistors 978, 980, 982 and 984 provide bias and scaling so that the node defined by resistors 978, 980 and 982 provides a 5 $V_{DC}$ reference. The capacitor 986 provides feedback compensation.

The inrush control circuit 820 comprises an amplifier 990, a capacitor 992, resistors 994, 996 and 998, and a MOSFET

999. The inrush control circuit 820 generates an initial control signal that gradually increases the pulse width generated by the pulse-width modulator circuit 812. The gradually increasing pulse width limits the inrush current, thereby providing circuit protection.

Operation of the inrush control circuit 820 beings when the reset signal $E_N$ goes low, which causes the MOSFET 999 to shut off. The amplifier 990 and capacitor 992 begin generating an increasing ramp output control signal. This control signal is provided to an OR circuit 890 comprising resistors 892, 894 and 896 and diodes 898, 900 and 902. The OR circuit 890 compares the outputs of the amplifiers 870, 884, and 990 and provides the resultant control signal to the pulse-width modulator circuit 812. Thus the inrush control circuit 820 provides initial inrush control until the pumped storage device 800 enters one of its normal operating modes.

Figure 10:
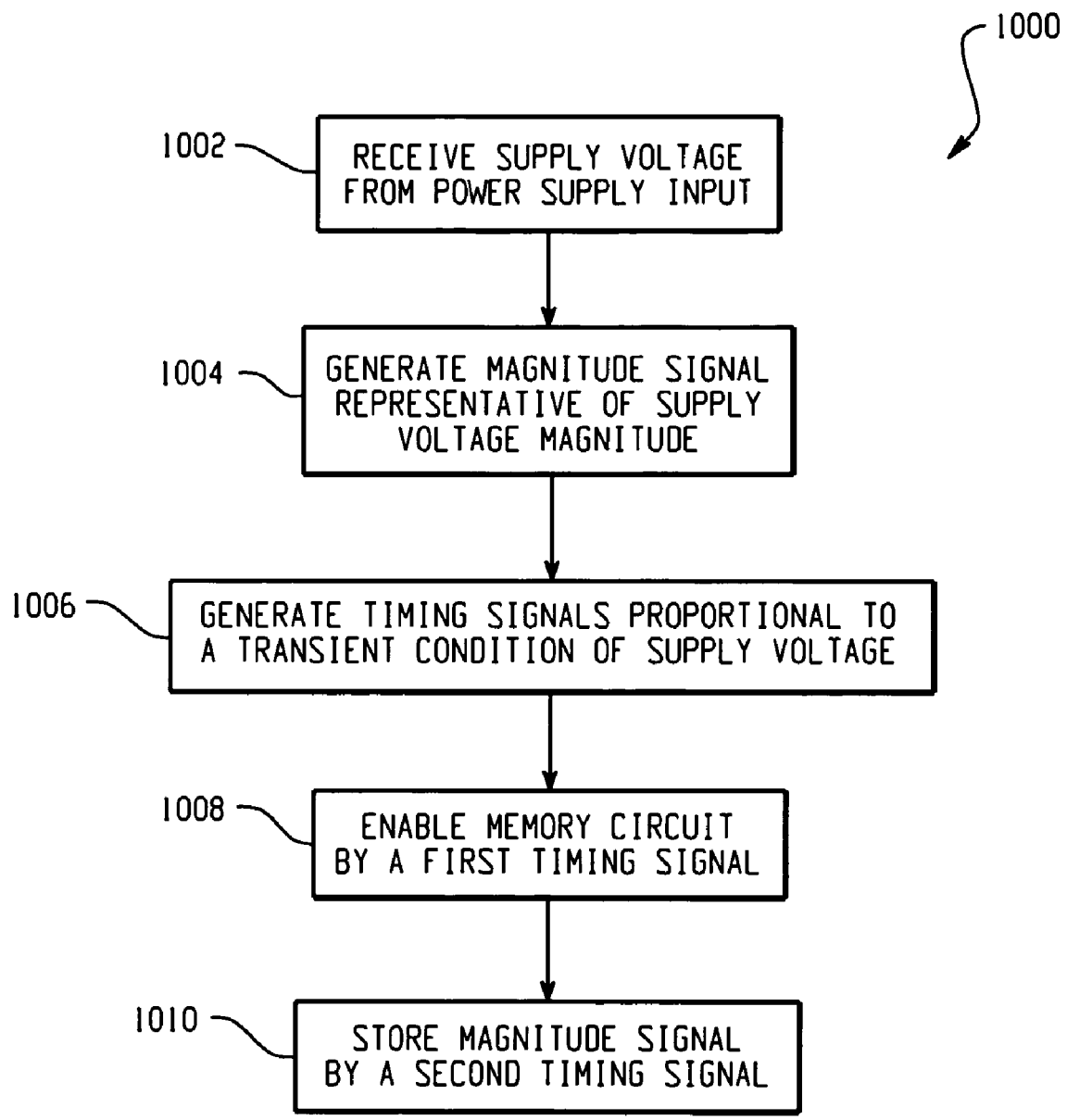
FIG. 10 is an example power processing flow diagram for the power supply detection circuit.

FIG. 10 is an example power processing flow diagram 1000 for power supply detection circuit 22. At 1002, a power supply voltage from a power supply input is received. At 1004, a magnitude signal representative of the power supply voltage magnitude is generated. At 1006, the generation of timing signals proportional to a transient condition of the power supply voltage is started. At 1008, a memory circuit is enabled by a first timing signal, and at 1010, a second timing signal causes the magnitude signal to be stored in the memory circuit.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A power circuit, comprising:
    a power supply detection circuit, including
        an input voltage magnitude detector circuit configured to receive a first supply voltage from a power supply input and generate a magnitude signal representative of the magnitude of the first supply voltage;
        a timing signal generation circuit configured to generate timing signals that are relative to a transient condition associated with the first supply voltage upon connection to the power supply input; and
        a data store circuit connected to the input voltage magnitude detector circuit and the timing signal generation circuit and configured to store the magnitude signal upon receiving a first timing signal from the timing signal generation circuit; and
    a power supply circuit connected to the power supply detection circuit and configured to operate in one of a plurality of magnitude modes, the magnitude modes dependent on the value of the magnitude signal.

2. The power circuit of claim 1, wherein the power supply circuit is further configured to be activated upon receiving a second timing signal from the timing signal generation circuit, the second timing signal occurring after a time period following the first timing signal.

3. The power circuit of claim 1, wherein the magnitude signal is representative of a predetermined power supply voltage magnitude.

4. The power circuit of claim 1, wherein the input voltage magnitude detector circuit includes
    a voltage divider circuit configured to generate a divided voltage proportional to the first supply voltage;
    a comparison circuit configured to compare the divided voltage to a reference voltage and generate magnitude signal based on the comparison.

5. The power circuit of claim 1, wherein the timing signal generation circuit includes
    a first time delay circuit configured to generate a reset signal relative to the transient condition associated with the first supply voltage upon connection to the power supply input; and
    a second time delay circuit configured to generate the first timing signal after a time period following the generation of the reset signal.

6. The power circuit of claim 5, wherein the data store comprises a latch configured to receive the reset signal as a reset input, the first timing signal as a clock input, and the magnitude signal as a data input.

7. The power circuit of claim 1, wherein the power supply circuit includes a load management circuit including a plurality of state transition circuits configured to provide a plurality of corresponding control signals indicative of when a plurality of corresponding load elements may draw current, each state transition circuit generating its corresponding control signal in response to a comparison of the first supply voltage to corresponding reference voltages, wherein one or more of the state transition circuits is configured to operate in a first magnitude mode by setting its corresponding reference voltages to a first magnitude reference scale in response to the magnitude signal and operate in a second magnitude mode by setting its corresponding reference voltages to a second magnitude reference scale in response to the value of the magnitude signal.

8. The power circuit of claim 1, wherein the power supply circuit includes a power input protection circuit including
    a pass circuit for controlling power distribution to a load, the pass device configured to block current flow to a load when in an off state;
    a high-voltage sensing circuit coupled to the pass circuit and configured to detect an over-voltage condition and generate an over-voltage signal that causes the pass circuit to switch to the off state; and
    a current sensing circuit coupled to the pass circuit and configured to detect a high current condition and to generate a current limiting signal to limit the current flow in the pass circuit in response to the high current condition;
    wherein at least one of the current limiter circuit and the high-voltage sensing circuit is configured to operate in a first magnitude mode or a second magnitude mode, the first and second magnitude modes selected in response to the value of the magnitude signal.

9. The power circuit of claim 2, wherein the power supply circuit includes a pumped capacitive storage element including
    an energy storage device coupled to the power supply input and configured to store at least a portion of input power from the first supply voltage and supply stored energy to the power supply input; and
    a pump circuit coupled to the power supply input and the energy storage device and configured to cause the energy storage device to store at least a portion of the input power when the first supply voltage is above a first threshold level, and to cause the energy storage device to stop receiving energy from the power supply input when the energy storage device voltage is at a second threshold level, wherein the first and second threshold levels are set to respective first and second reference values in a first magnitude mode and set to respective third and fourth reference values in a second magnitude mode, the first and second magnitude modes selected in response to the value of the magnitude signal.

10. The power circuit of claim 1, wherein the first supply voltage is a direct current (DC) voltage.

11. The power circuit of claim 10, wherein the first supply voltage is transmitted over a transmission line, and wherein the transient condition associated with the first supply voltage is a resisitive-capacitive charge characteristic.

12. A power supply detection device, comprising:
an input voltage magnitude detector circuit configured to receive a first supply voltage from a power supply input and generate a magnitude signal representative of the magnitude of the first supply voltage;
a timing signal generation circuit configured to generate timing signals that are proportional to a transient condition associated with the first supply voltage upon connection to the power supply input; and
a memory circuit connected to the timing signal generation circuit and the input voltage magnitude detector circuit and configured to be enabled upon receiving a first timing signal from the timing signal generation circuit and to store the magnitude signal upon receiving a second timing signal from the timing signal generation circuit;
wherein the magnitude signal is representative of a predetermined power supply magnitude.

13. The power supply detection device of claim 12, wherein the input voltage magnitude detector circuit includes
a voltage divider circuit configured to generate a divided voltage proportional to the first supply voltage; and
a comparison circuit configured to compare the divided voltage to a reference voltage and generate magnitude signal based on the comparison.

14. The power supply detection device of claim 12, wherein the timing signal generation circuit includes
a first time delay circuit configured to generate the first timing signal relative to the transient condition associated with the first supply voltage upon connection to the power supply input; and
a second time delay circuit configured to generate the first timing signal after a time period following the generation of first timing signal.

15. The power supply detection device of claim 12, further comprising a power supply circuit connected to the power supply detection circuit and configured to operate in one of a plurality of magnitude modes, the magnitude modes dependent on the value of the magnitude signal stored in the memory circuit.

16. The power supply detection device of claim 15, wherein the power supply circuit includes a load management circuit included a plurality of state transition circuits configured to provide a plurality of corresponding control signals indicative of when a plurality of corresponding load elements may draw current, each state transition circuit generating its corresponding control signal in response to a comparison of the first supply voltage to corresponding reference voltages, wherein one or more of the state transition circuits is configured to operate in a first magnitude mode by setting its corresponding reference voltages to a first magnitude reference scale in response to the magnitude signal and operate in a second magnitude mode by setting its corresponding reference voltage to a second magnitude reference scale in response to the value of the magnitude signal.

17. The power supply detection device of claim 15, wherein the power supply circuit includes a power input protection circuit including
a pass circuit for controlling power distribution to a load, the pass device configured to block current flow to a load when in an off state;
a high-voltage sensing circuit coupled to the pass circuit and configured to detect an over-voltage condition and generate an over-voltage signal that causes the pass circuit to switch to the off state; and
a current sensing circuit coupled to the pass circuit and configured to detect a high current condition and to generate a current limiting signal to limit the current flow in the pass circuit in response to the high current condition;
wherein at least one of the current limiter circuit and the high-voltage sensing circuit is configured to operate in a first magnitude mode or a second magnitude mode, the first and second magnitude modes selected in response to the value of the magnitude signal.

18. The power supply detection device of claim 15, wherein the power supply circuit includes a pumped capacitive storage element including
an energy storage device coupled to the power supply input and configured to store at least a portion of input power from the first supply voltage and supply stored energy to the power supply input; and
a pump circuit coupled to the power supply input and the energy storage device and configured to cause the energy storage device to store at least a portion of the input power when the first supply voltage is above a first threshold level, and to cause the energy storage device to stop receiving energy from the power supply input when the energy storage device voltage is at a second threshold level, wherein the first and second threshold levels are set to respective first and second reference values in a first magnitude mode and set to respective third and fourth reference values in a second magnitude mode, the first and second magnitude modes selected in response to the value of the magnitude signal.

19. A power processing method, comprising:
receiving a first supply voltage from a power supply input;
generating a magnitude signal representative of the magnitude of the first supply voltage;
generating timing signals that are proportional to a transient condition associated with the first supply voltage upon receiving the first supply voltage;
selectively enabling a memory circuit by a first generated timing signal;
selectively storing the magnitude signal according to a second generated timing signal;
wherein the timing signals are generated at timing intervals so that the stored magnitude signal is representative of a predetermined power supply magnitude.

20. The power processing method of claim 19, further comprising:
configuring a power supply circuit to operate in a plurality of magnitude modes; and
selecting one of the magnitude modes in response to the value of the stored magnitude signal.

21. The power processing method of claim 20, further comprising enabling energization of the power supply circuit only after selectively storing of the magnitude signal.

22. A power processing circuit, comprising:
means for receiving a first supply voltage from a power supply input;
means for generating a magnitude signal representative of the magnitude of the first supply voltage;
means generating timing signals that are proportional to a transient condition associated with the first supply voltage upon receiving the first supply voltage;
means for selectively storing the magnitude signal;
wherein the timing signals are generated at timing intervals so that the stored magnitude signal is representative of a predetermined power supply magnitude.

* * * * *